US012727135B2

(12) United States Patent
Liao et al.

(10) Patent No.: US 12,727,135 B2
(45) Date of Patent: Sep. 1, 2026

(54) INSULATING THIN FILM

(71) Applicant: ILLINOIS TOOL WORKS INC., Glenview, IL (US)

(72) Inventors: Hongchuan Liao, Glenview, IL (US); Chunhua Yang, Glenview, IL (US)

(73) Assignee: Illinois Tool Works Inc., Glenview, IL (US)

( * ) Notice: Subject to any disclaimer, the term of this patent is extended or adjusted under 35 U.S.C. 154(b) by 842 days.

(21) Appl. No.: 16/625,283

(22) PCT Filed: Jun. 20, 2018

(86) PCT No.: PCT/US2018/038449
§ 371 (c)(1),
(2) Date: Dec. 20, 2019

(87) PCT Pub. No.: WO2018/236968
PCT Pub. Date: Dec. 27, 2018

(65) Prior Publication Data

US 2021/0410345 A1 Dec. 30, 2021

(30) Foreign Application Priority Data

Jun. 20, 2017 (CN) ......................... 201710471387.2
Jun. 20, 2017 (CN) ......................... 201720719818.8
(Continued)

(51) Int. Cl.
*H05K 9/00* (2006.01)
*B29C 48/07* (2019.01)
(Continued)

(52) U.S. Cl.
CPC ........... *H05K 9/0086* (2013.01); *B29C 48/07* (2019.02); *B29C 48/154* (2019.02); (Continued)

(58) Field of Classification Search
None
See application file for complete search history.

(56) References Cited

U.S. PATENT DOCUMENTS 4,029,837 A * 6/1977 Leatherman .............. B32B 7/12 442/16
9,942,989 B2 * 4/2018 Liao ........................ B32B 27/32
(Continued)

FOREIGN PATENT DOCUMENTS

CN 103854813 6/2014
CN 104837629 8/2015
(Continued)

OTHER PUBLICATIONS

European Office Communication AppIn No. 18739707.0 dated Aug. 25, 2022.

(Continued)

*Primary Examiner* — Ramsey Zacharia
(74) *Attorney, Agent, or Firm* — McAndrews Held & Malloy, Ltd.

(57) ABSTRACT

Provided is an insulating thin film for insulating an electronic device, an electronic component, an electronic element, or an electronic element in an electronic device or an electronic component, characterized in that the insulating thin film comprises: an upper thin film layer and a lower thin film layer, wherein said upper thin film layer and lower thin film layer are formed from the same insulating material or similar insulating materials; and said insulating thin film is integrally formed by subjecting said upper thin film layer and said lower thin film layer to a co-extrusion process, such that the breakdown resistance of the insulating thin film can be improved.

12 Claims, 7 Drawing Sheets

(30) Foreign Application Priority Data

| | | |
|---|---|---|
| Jun. 20, 2017 | (CN) | 201720719824.3 |
| May 16, 2018 | (CN) | 201810469235.3 |
| May 16, 2018 | (CN) | 201820731437.6 |

(51) Int. Cl.

| | |
|---|---|
| ***B29C 48/154*** | (2019.01) |
| ***B29C 48/88*** | (2019.01) |
| ***B29K 23/00*** | (2006.01) |
| ***B29K 705/10*** | (2006.01) |
| ***B32B 15/02*** | (2006.01) |
| ***B32B 15/085*** | (2006.01) |
| ***H01B 17/60*** | (2006.01) |
| ***H01M 50/224*** | (2021.01) |
| ***H01M 50/227*** | (2021.01) |
| ***H01M 50/231*** | (2021.01) |

(52) U.S. Cl.

CPC ............ *B29C 48/914* (2019.02); *B32B 15/02* (2013.01); *B32B 15/085* (2013.01); *H01B 17/60* (2013.01); *H01M 50/224* (2021.01); *H01M 50/227* (2021.01); *H01M 50/231* (2021.01); *B29K 2023/12* (2013.01); *B29K 2705/10* (2013.01); *B32B 2250/03* (2013.01); *B32B 2250/40* (2013.01); *B32B 2307/304* (2013.01); *B32B 2457/10* (2013.01); *H01M 2220/20* (2013.01)

(56) References Cited

U.S. PATENT DOCUMENTS

| | | | | |
|---|---|---|---|---|
| 10,300,684 | B2 * | 5/2019 | Liao | B32B 27/18 |
| 10,576,717 | B2 * | 3/2020 | Liao | B32B 37/12 |
| 2015/0306851 | A1 * | 10/2015 | Liao | B32B 27/18 428/483 |
| 2016/0059523 | A1 * | 3/2016 | Liao | B29C 48/21 156/324 |

FOREIGN PATENT DOCUMENTS

| | | |
|---|---|---|
| CN | 104936773 | 9/2015 |
| CN | 104955640 | 9/2015 |
| EP | 2 602 095 | 6/2013 |
| GB | 2 170 450 | 8/1986 |
| WO | 96/26067 | 8/1996 |

OTHER PUBLICATIONS

Nam Baekil: "RF Power Absorption Enhancement by Optimization of the Conductive Grid in a Magnetic Composite", Nov. 1, 2014 (Nov. 1, 2014), XP055952920, Retrieved from the Internet: URL:https://ieeexplore.ieee.org/abstract/document/6971450 [retrieved on Aug. 18, 2022].

International Search Report and Written Opinion corresponding to International Patent Application No. PCT/US2018/038449, mailed Nov. 23, 2018.

* cited by examiner

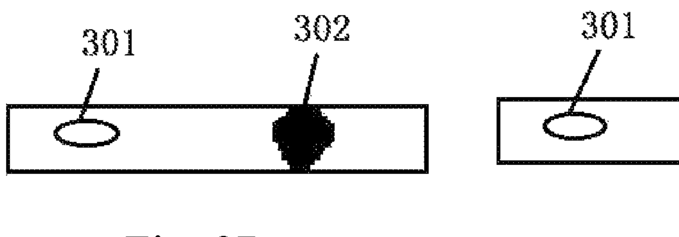
Fig. 3B
Fig. 3C
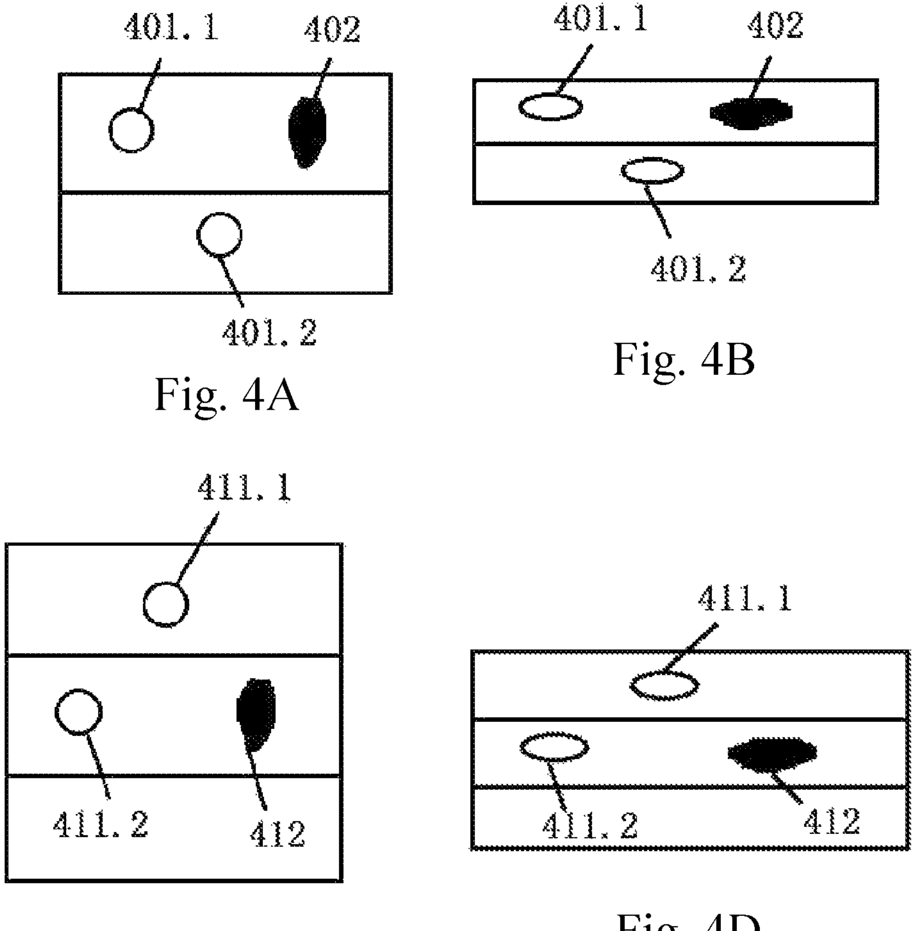
Fig. 4A
Fig. 4B
Fig. 4C
Fig. 4D

INSULATING THIN FILM

TECHNICAL FIELD

The present application relates to an insulating thin film, and more particularly to an insulating thin film having an anti-breakdown function, which is used for insulating an electronic device.

BACKGROUND

The insulating thin film is used for electrically isolating various conductive electronic devices or components to avoid failures caused by short-circuiting, breakdown, etc., between electronic devices or components, or of electronic elements and parts in electronic devices or components, thereby ensuring various electronic elements and parts to work properly. In addition, due to the service environment of a relatively high temperature and a relatively small space, insulating thin films need to have a flame retardant function to reduce the risk of fire of electronic devices or components. Therefore, for different uses of insulating thin films, the insulating thin films are required to have different operating characteristics.

Therefore, it is desirable to provide an improved insulating thin film and process, such that the improved insulating thin film has better, longer lasting insulating properties.

Furthermore, it is desirable to provide an improved insulating thin film and process for improving the pass rate of production of improved insulating thin films.

SUMMARY

In order to overcome the deficiencies of the prior art, according to a first aspect of the present application, there is provided an insulating thin film for insulating an electronic device, an electronic component, an electronic element, or an electronic element in an electronic device or an electronic component, characterized in that said insulating thin film comprises an upper thin film layer and a lower thin film layer, wherein said upper thin film layer and said lower thin film layer are formed from an insulating material; and said insulating thin film is integrally formed by subjecting said upper thin film layer and said lower thin film layer to a co-extrusion process.

The insulating thin film as described above is characterized in that said upper thin film layer and said lower thin film layer are formed from the same insulating material.

The insulating thin film as described above is characterized in that said upper thin film layer and said lower thin film layer are formed from similar insulating materials.

The insulating thin film as described above is characterized in that said insulating material comprises a thermoplastic resin.

The insulating thin film as described above is characterized in that said thermoplastic resin comprises PP, PC or PET, and the total thickness of said thin film is 0.05-0.25 mm.

The insulating thin film as described above is characterized in that said insulating material further comprises a flame retardant, said flame retardant is a halogen-containing flame retardant or a halogen-free flame retardant, said halogen-containing flame retardant is a bromine-containing flame retardant or a chlorine-containing flame retardant, said halogen-free flame retardant is a phosphorus-containing flame retardant or a nitrogen-containing or silicon-containing or sulfur-containing or inorganic flame retardant, the flame retardant rating of said insulating thin film is V-2 or VTM-2 or higher, preferably V-0 or VTM-0, the CTI of said insulating thin film is 175 volts or more, preferably 600 volts or more, and the RTI of said insulating thin film is 90° C. or more.

The insulating thin film as described above is characterized in that in said co-extrusion process, the insulating material is extruded on a first extruder and melted, and the insulating material in the molten state flows out from the first extruder and then enters a dispenser via a subsequent connecting pipe to become a first molten insulating material;

the insulating material is extruded on a second extruder and melted, and the insulating material in the molten state flows out from the second extruder and then enters the dispenser via a subsequent connecting pipe to become a second molten insulating material; and the first molten insulating material and the second molten insulating material are stacked together in the dispenser and then flow out from the dispenser, flow through a die, then enter cooling forming rollers and are cooled to form a sheet/film.

The insulating thin film as described above is characterized in that the insulating material for manufacturing said upper thin film layer comprises PP and a flame retardant;

and the insulating material for manufacturing said lower thin film layer comprises PP and a flame retardant.

The insulating thin film as described above is characterized in that the insulating material for manufacturing said upper thin film layer comprises PC and a flame retardant;

and the insulating material for manufacturing said lower thin film layer comprises PC and a flame retardant.

The insulating thin film as described above is characterized in that the insulating material for manufacturing said upper thin film layer comprises PET and a flame retardant;

and the insulating material for manufacturing said lower thin film layer comprises PET and a flame retardant.

In order to overcome the deficiencies of the prior art, according to a second aspect of the present application, there is provided an insulating thin film for insulating an electronic device, an electronic component, an electronic element, or an electronic element in an electronic device or an electronic component, characterized in that said insulating thin film comprises an upper thin film layer, a middle thin film layer and a lower thin film layer, wherein said upper thin film layer, said middle thin film layer and said lower thin film layer are formed from an insulating material; and said insulating thin film is integrally formed by subjecting said upper thin film layer, said middle thin film layer and said lower thin film layer to a co-extrusion process.

The insulating thin film as described above is characterized in that said upper thin film layer, said middle thin film layer and said lower thin film layer are formed from the same insulating material.

The insulating thin film as described above is characterized in that said upper thin film layer, said middle thin film layer and said lower thin film layer are formed from similar insulating materials.

The insulating thin film as described above is characterized in that said insulating material comprises a thermoplastic resin.

The insulating thin film as described above is characterized in that said thermoplastic resin comprises PP, PC or PET, and the total thickness of said thin film is 0.05-0.25 mm.

The insulating thin film as described above is characterized in that said insulating material further comprises a flame retardant.

The insulating thin film as described above is characterized in that in said co-extrusion process, the insulating material is extruded on a first extruder and melted, and the insulating material in the molten state flows out from the first extruder and then enters a dispenser via a subsequent connecting pipe to become a first molten insulating material;

the insulating material is extruded on a second extruder and melted, and the insulating material in the molten state flows out from the second extruder and then enters the dispenser via a subsequent connecting pipe to become a second molten insulating material; and the insulating material is extruded on a third extruder and melted, and the insulating material in the molten state flows out from the third extruder and then enters the dispenser via a subsequent connecting pipe to become a third molten insulating material; and the first molten insulating material, the second molten insulating material and the third molten insulating material are stacked together in the dispenser and then flow out from said dispenser, flow through a die, then enter cooling forming rollers and are cooled to form a sheet/film.

The insulating thin film as described above is characterized in that in said co-extrusion process, the insulating material is extruded on a first extruder and melted, and the insulating material in the molten state flows out from the first extruder and then enters a dispenser via a subsequent connecting pipe, and in the dispenser, the molten insulating material extruded from the first extruder is divided into two branches, i.e., respectively a first molten insulating material and a third molten insulating material;

the insulating material is extruded on a second extruder and melted, and the insulating material in the molten state flows out from the second extruder and then enters the dispenser via a subsequent connecting pipe to become a second molten insulating material; and the first molten insulating material, the second molten insulating material and the third molten insulating material are stacked together in the dispenser and then flow out from said dispenser, flow through a die, then enter cooling forming rollers and are cooled to form a sheet/film.

The insulating thin film as described above is characterized in that the insulating material for manufacturing said upper thin film layer comprises PP and a flame retardant;

the insulating material for manufacturing said middle thin film layer comprises PP and a flame retardant;

and the insulating material for manufacturing said lower thin film layer comprises PP and a flame retardant.

The insulating thin film as described above is characterized in that the insulating material for manufacturing said upper thin film layer comprises PC and a flame retardant;

the insulating material for manufacturing said middle thin film layer comprises PC and a flame retardant;

and the insulating material for manufacturing said lower thin film layer comprises PC and a flame retardant.

The insulating thin film as described above is characterized in that the insulating material for manufacturing said upper thin film layer comprises PET and a flame retardant;

the insulating material for manufacturing said middle thin film layer comprises PET and a flame retardant;

and the insulating material for manufacturing said lower thin film layer comprises PET and a flame retardant.

It is recognized in the present application that by changing the structure of a traditional single-layer insulating thin film into two layers or three or more layers, the following two deficiencies of the structure of the traditional single-layer insulating thin film are overcome without changing the material of the single-layer insulating thin film: (1) the voltage breakdown withstanding performance across the entire single-layer insulating thin film may be uneven, and during use, some parts are easily broken down due to the influence of foreign matters (such as dust particles) and/or bubbles in a specified service environment, this deficiency of potential breakdown being difficult to predict in advance; and (2) by product testing, it is found that in the production process, due to the influence of foreign matters (such as dust particles) and bubbles, the pass rate is reduced.

BRIEF DESCRIPTION OF THE DRAWINGS

These and other features and advantages of the present application can be better understood by reading the following detailed description with reference to the accompanying drawings, and throughout the drawings, like reference signs denote like parts, in which:

FIGS. 3B and 3C are respectively schematic views of cross-sections of two cases of the thin film substrate after being extruded in the single-layer extrusion process;

FIG. 4A is a schematic view of a cross-section of a thin film substrate before being extruded in a two-layer co-extrusion process;

FIG. 4B is a schematic view of a cross-section of the thin film substrate after being extruded in the two-layer co-extrusion process;

FIG. 4C is a schematic view of a cross-section of a thin film substrate before being extruded in a three-layer co-extrusion process;

FIG. 4D is a schematic view of a cross-section of the thin film substrate after being extruded in the three-layer extrusion process;

DETAILED DESCRIPTION

Various specific embodiments of the present application will be described below with reference to the accompanying drawings, which form part of this description. It should be understood that although parts and elements of various exemplary structures of the present application are described herein using terms indicating directions, e.g., the direction or position terms of "front", "back", "upper", "lower", "left", "right", etc., these terms are used herein for ease of description only, and are determined based on the exemplary positions as shown in the accompanying drawings. Since the embodiments disclosed in the present application can be set according to different directions, these terms indicating directions are merely illustrative and should not be construed as limiting. In the following drawings, like parts use like reference signs, and similar parts use similar reference signs, to avoid redundant description.

Figure 1A:
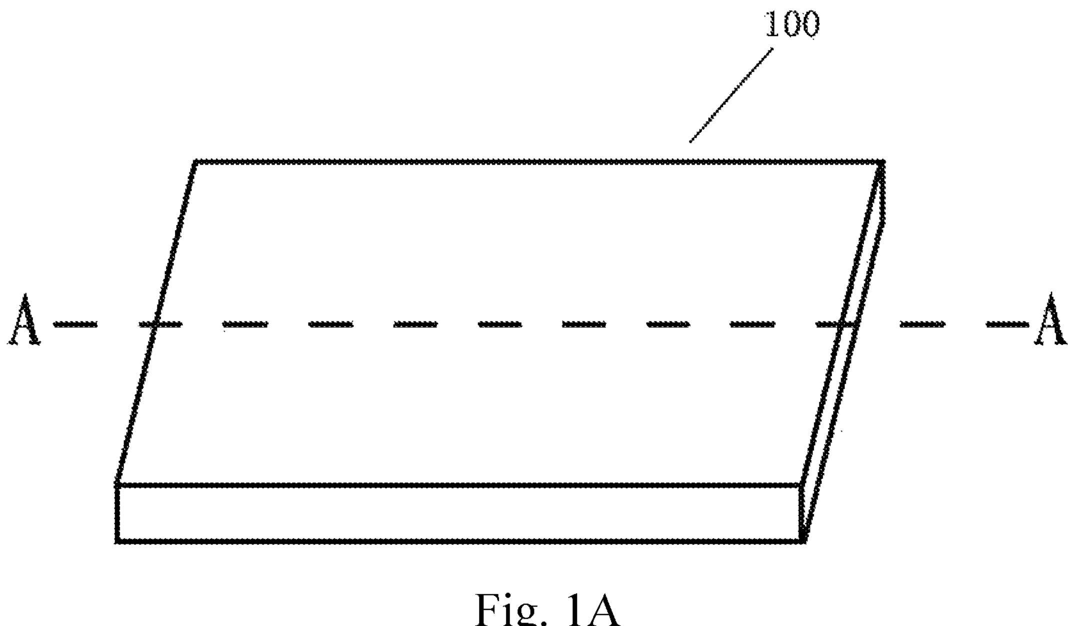
FIG. 1A is a schematic view of an insulating thin film according to an embodiment of the present application.
Figure 1B:
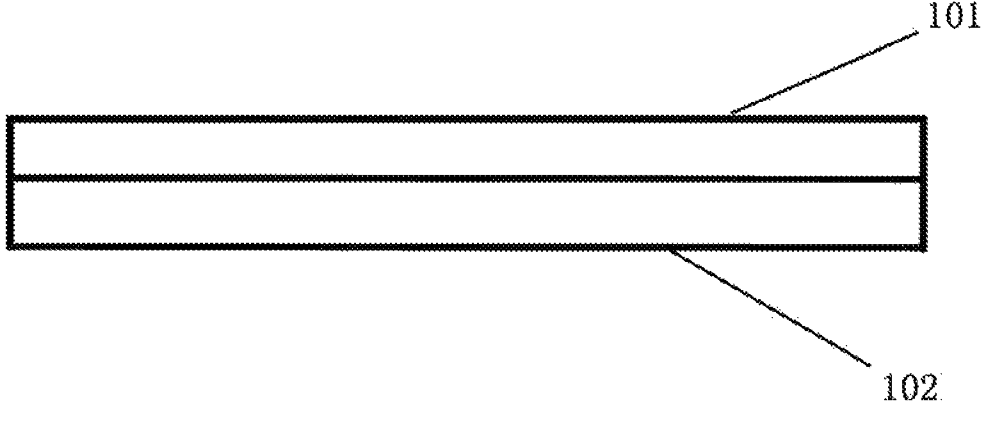
FIG. 1B is a schematic view of the insulating thin film in FIG. 1A cut along section A-A.

FIG. 1A shows a schematic view of an insulating thin film 100 according to an embodiment of the present application. FIG. 1B is a schematic view of a cross-section of the insulating thin film 100 in FIG. 1A cut along section A-A.

As shown in FIG. 1B, the insulating thin film 100 comprises an upper thin film layer 101 and a lower thin film layer 102. In one embodiment, the upper thin film layer 101 and the lower thin film layer 102 are made of the same, substantially the same, or similar materials and have the same or similar insulating functions. In order to perform the insulating and flame retardant functions of the insulating thin film, the upper thin film layer 101 and the lower thin film layer 102 of the insulating thin film 100 may be made of a mixture comprising a flame retardant and a thermoplastic resin by means of a co-extrusion process described hereinafter. In the mixture, the thermoplastic resin is PP, PC or PET, and the flame retardant comprises a halogen-free flame retardant or a halogen-containing flame retardant. The halogen-containing flame retardant is a bromine-containing flame retardant or a chlorine-containing flame retardant, and the halogen-free flame retardant is a phosphorus-containing flame retardant or a nitrogen-containing or silicon-containing or sulfur-containing or inorganic flame retardant. The above flame retardants all meet the requirements of RoHS standard. The flame retardant rating of the insulating thin film 100 provided by the present application is V-2 or VTM-2 or higher, or may even reach V-0 or VTM-0. The CTI (Comparative Tracking Index) of the insulating thin film 100 in the present application may reach 175 volts or more, or may even reach 600 volts or more. The RTI (Relative Thermal Index) of the insulating thin film in the present application may reach 90° C. or more.

According to the principle of the present application, the materials of the upper thin film layer 101 and the lower thin film layer 102 of the insulating thin film 100 being the same, substantially the same or similar means that the selection and composition of the materials of the upper thin film layer 101 and the lower thin film layer 102 of the insulating thin film 100 are for the purpose of (or mainly for the purpose of) performing the insulating function or the insulating and flame retardant functions. That is to say, if there are differences between the formulations of the materials for manufacturing the upper thin film layer and the lower thin film layer, but these differences do not significantly change the properties of the thin film, including insulating properties or insulating and flame retardant properties, such differences should be understood as "similar" in the present application, and such insulating thin films are also within the principle of the present application. The same or similar formulations used for manufacturing the upper thin film layer 101 and the lower thin film layer 102 of the insulating thin film 100 in the present application may be the existing formulation for insulating or insulating and flame retardant single-layer insulating thin films. If there is a minor difference in the materials of the upper thin film layer 101 and the lower thin film layer 102 caused by raw material batches or errors in practical production, this case is also within the scope of the principle of the present application.

In one embodiment of the present application, the upper thin film layer 101 and the lower thin film layer 102 have the same thickness. In another embodiment of the insulating thin film, where the total thickness of the insulating thin film 100 is determined, the thicknesses of the upper thin film layer 101 and the lower thin film layer 102 have a certain difference, and it is acceptable as long as the sum of the thicknesses of the upper thin film layer 101 and the lower thin film layer 102 is guaranteed to meet the total thickness requirement of the insulating thin film 100. One benefit of having a certain difference in the thicknesses of the upper thin film layer 101 and the lower thin film layer 102 is to facilitate process control.

According to one embodiment of the present application, the mass of the flame retardant in the upper layer 101 and the lower layer 102 of the insulating thin film 100 is 5-50% of the mass of the upper layer 101 or the lower layer 102 of the insulating thin film 100, and the mass of the thermoplastic resin in the upper layer 101 and the lower layer 102 of the insulating thin film 100 is 50-95% of the mass of the upper layer 101 or the lower layer 102 of the insulating thin film 100. The content of the flame retardant in each layer of the insulating thin film can meet the requirements for the flame retardancy of the insulating thin film 100. The following table lists the components of the insulating thin films of several specific examples.

| | | Thermoplastic resin type | Mass content of thermoplastic resin (%) | Flame retardant type | Mass content of flame retardant (%) |
|---|---|---|---|---|---|
| Example 1 | Upper layer | PP | 50 | Halogen-containing flame retardant | 50 |

-continued

| | | Thermoplastic resin type | Mass content of thermoplastic resin (%) | Flame retardant type | Mass content of flame retardant (%) |
|---|---|---|---|---|---|
| | Lower layer | PP | 50 | Halogen-containing flame retardant | 50 |
| Example 2 | Upper layer | PET | 95 | Halogen-free flame retardant | 5 |
| | Lower layer | PET | 95 | Halogen-free flame retardant | 5 |
| Example 3 | Upper layer | PC | 95 | Halogen-free flame retardant | 5 |
| | Lower layer | PC | 95 | Halogen-free flame retardant | 5 |

According to one embodiment of the present application, the upper layer 101 and the lower layer 102 of the insulating thin film 100 contain only a thermoplastic resin and a flame retardant.

According to one embodiment of the present application, the thickness of the insulating thin film 100 is 0.05-3.2 mm. According to another embodiment of the present application, the thickness of the insulating thin film 100 is 0.05-0.25 mm. According to yet another embodiment of the present application, the thickness of the insulating thin film 100 is 0.1-0.5 mm.

Since the selection and composition of the materials of the upper thin film layer 101 and the lower thin film layer 102 of the insulating thin film 100 are for the purpose of (or mainly for the purpose of) performing the insulating function or the insulating and flame retardant functions. Extrusion processes are used in traditional structures and processes to manufacture single-layer insulating thin films having the same total thickness as the insulating thin film 100 comprising the upper thin film layer 101 and the lower thin film layer 102 of the present application. However, the single-layer insulating thin films manufactured by the traditional structures and processes have some deficiencies. In contrast, for the insulating thin film 100 of the present application, a traditional single-layer insulating thin film having a certain thickness specification is divided into two layers (an upper thin film layer 101 and a lower thin film layer 102), and the two layers are extruded and bonded together using a co-extrusion process to form the insulating thin film 100, in order to overcome the deficiencies of the single-layer insulating thin films manufactured by the traditional structures and processes (which will be described in detail in FIGS. 3A to 4D).

Figure 2A:
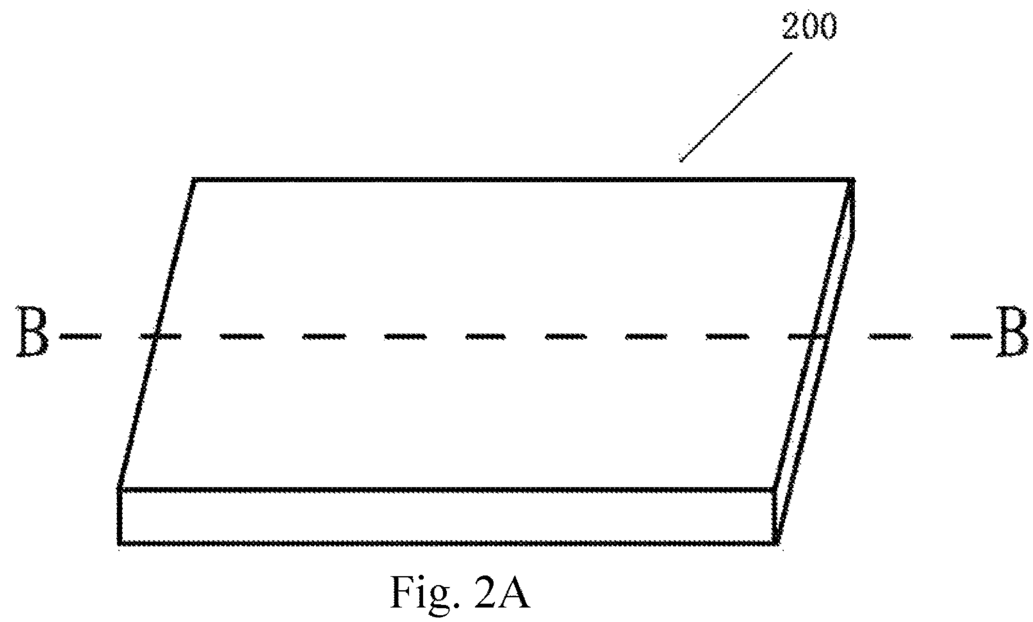
FIG. 2A is a schematic view of an insulating thin film according to another embodiment of the present application.
Figure 2B:
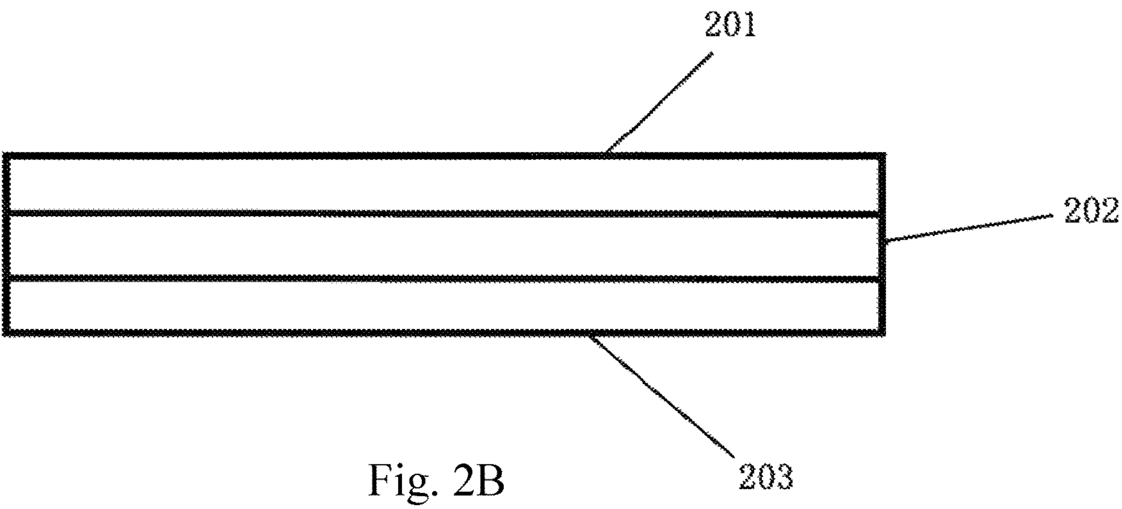
FIG. 2B is a schematic view of the insulating thin film in FIG. 2A cut along section B-B.

FIG. 2A shows a schematic view of an insulating thin film 200 according to an embodiment of the present application. FIG. 2B is a schematic view of a cross section of the insulating thin film 200 in FIG. 2A cut along section B-B.

Similarly to the insulating thin film 100 in Figures 1A and 1B, the insulating thin film 200 comprises an upper thin film layer 201, a middle thin film layer 202 and a lower thin film layer 203, as shown in FIG. 2B. In one embodiment of the present application, the upper thin film layer 201, the middle thin film layer 202 and the lower thin film layer 203 are made of the same, substantially the same, or similar materials and have the same or similar insulating functions. In order to perform the insulating and flame retardant functions of the insulating thin film, the upper thin film layer 201, the middle thin film layer 202 and the lower thin film layer 203 of the insulating thin film 200 are made of a mixture comprising a flame retardant and a thermoplastic resin by means of a co-extrusion process described hereinafter. In the mixture, the thermoplastic resin is PP, PC or PET, and the flame retardant comprises a halogen-free flame retardant or a halogen-containing flame retardant. The halogen-containing flame retardant is a bromine-containing flame retardant or a chlorine-containing flame retardant, and the halogen-free flame retardant is a phosphorus-containing flame retardant or a nitrogen-containing or silicon-containing or sulfur-containing or inorganic flame retardant. The above flame retardants all meet the requirements of RoHS standard. The flame retardant rating of the insulating thin film 200 provided by the present application is V-2 or VTM-2 or higher, or may even reach V-0 or VTM-0. The CTI (Comparative Tracking Index) of the insulating thin film 200 in the present application may reach 175 volts or more, or may even reach 600 volts or more. The RTI (Relative Thermal Index) of the insulating thin film in the present application may reach 90° C. or more.

According to the principle of the present application, the materials of the upper thin film layer 201, the middle thin film layer 202 and the lower thin film layer 203 of the insulating thin film 200 being the same, substantially the same or similar means that the selection and composition of the materials of the upper thin film layer 201, the middle thin film layer 202 and the lower thin film layer 203 of the insulating thin film 200 are for the purpose of (or mainly for the purpose of) performing the insulating function or the insulating and flame retardant functions. That is to say, if there are differences between the formulations of the materials for manufacturing the upper thin film layer, the middle thin film layer and the lower thin film layer, but such differences do not significantly change the properties of the thin film, including insulating properties or insulating and flame retardant properties, such differences should be understood as “similar” in the present application, and such insulating thin films are also within the principle of the present application. The same or similar formulations used for manufacturing the upper thin film layer 201, the middle thin film layer 202 and the lower thin film layer 203 of the insulating thin film 200 in the present application may be the existing formulation for insulating or insulating and flame retardant single-layer insulating thin films. If there is a minor difference in the materials of the upper thin film layer 201, the middle thin film layer 202 and the lower thin film layer 203 caused by raw material batches or errors in practical production, this case is also within the scope of the principle of the present application.

In one embodiment of the present application, the upper thin film layer 201, the middle thin film layer 202 and the lower thin film layer 203 have the same thickness. In another embodiment of the present application, where the total thickness of the insulating thin film 200 is determined, the thicknesses of the upper thin film layer 201, the middle thin film layer 202 and the lower thin film layer 203 have a certain difference, and it is acceptable as long as the sum of the thicknesses of the upper thin film layer 201, the middle thin film layer 202 and the lower thin film layer 203 is guaranteed to meet the total thickness requirement of the insulating thin film 200. One benefit of having a certain difference in the thicknesses of the upper thin film layer 201, the middle thin film layer 202 and the lower thin film layer 203 is to facilitate process control.

According to one embodiment of the present application, the mass of the flame retardant in each of the upper thin film layer 201, the middle thin film layer 202, and the lower thin film layer 203 of the insulating thin film 200 is 5-50% of the mass of the layer, and the mass of the thermoplastic resin is 50-95% of the mass of the layer. The content of the flame retardant in each layer of the thin film can meet the requirements for the flame retardancy of the insulating thin film 200. The following table lists the components of the insulating thin films of several specific examples.

| | | Thermoplastic resin type | Mass content of thermoplastic resin (%) | Flame retardant type | Mass content of flame retardant (%) |
|---|---|---|---|---|---|
| Example 1 | Upper layer | PP | 50 | Halogen-containing flame retardant | 50 |
| | Middle layer | PP | 50 | Halogen-containing flame retardant | 50 |
| | Lower layer | PP | 50 | Halogen-containing flame retardant | 50 |
| Example 2 | Upper layer | PET | 95 | Halogen-free flame retardant | 5 |
| | Middle layer | PET | 95 | Halogen-free flame retardant | 5 |
| | Lower layer | PET | 95 | Halogen-free flame retardant | 5 |
| Example 3 | Upper layer | PC | 95 | Halogen-free flame retardant | 5 |
| | Middle layer | PC | 95 | Halogen-free flame retardant | 5 |
| | Lower layer | PC | 95 | Halogen-free flame retardant | 5 |

According to one embodiment of the present application, the upper layer 201, the middle thin film layer 202 and the lower thin film layer 203 of the insulating thin film contain only a thermoplastic resin and a flame retardant.

According to one embodiment of the present application, the thickness of the insulating thin film 200 is 0.05-3.2 mm. According to another embodiment of the present application, the thickness of the insulating thin film 200 is 0.05-0.25 mm. According to yet another embodiment of the present application, the thickness of the insulating thin film 200 is 0.1-0.5 mm.

Therefore, the insulating thin film 200 with a three-layer structure and the insulating thin film 100 with a two-layer structure are structurally similar, and the insulating thin film 200 with a three-layer structure also has the advantages of the insulating thin film 100 in FIGS. 1A and 1B. Of course, the principle of the present application is also applicable to insulating thin films with more layers, such as three or more layers.

Figure 3A:
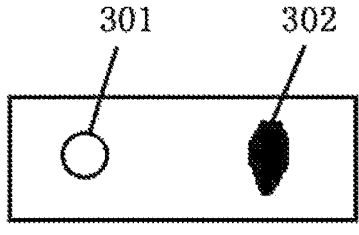
FIG. 3A is a schematic view of a cross-section of a thin film substrate before being extruded in a single-layer extrusion process.

In the production of traditional insulating films, an insulating thin film made of the same material is manufactured as a single layer. However, the applicant of the present application discovered that single-layer insulating thin films have deficiencies. FIGS. 3A-C show one reason for the deficiencies of single-layer insulating thin films manufactured by traditional structures and processes. FIG. 3A shows the molten state of the insulating material of an insulating thin film before being extruded (i.e., before entering a die) in a single-layer extrusion process. As shown in FIG. 3A, the insulating material in the molten state contains bubbles 301 and/or foreign matters 302 (e.g., dust), and the bubbles 301 and/or foreign matters 302 are randomly distributed and can move along with the insulating material in the molten state. As shown in FIG. 3B, after being extruded, the bubbles 301 and/or foreign matters 302 contained therein may come into contact (or slight contact) with the surface of the single-layer insulating thin film, so that after the single-layer insulating thin film is installed, once being used, the positions (where the bubbles 301 and/or foreign matters 302 in contact (or slight contact) with the surface of the single-layer insulating thin film are located) of the single-layer insulating thin film are easily broken down. Alternatively, as shown in FIG. 3C, after being extruded, the bubbles 301 and/or foreign matters 302 contained therein have a slight distance from the surface of the single-layer insulating thin film, so that after the single-layer insulating thin film is installed and used for a period of time, the positions where the bubbles 301 and/or foreign matters 302 are present in the single-layer insulating thin film are easily broken down, resulting in electronic elements and parts not to function properly.

The present application provides an insulating thin film with a two or more-layer structure to overcome the deficiencies of the traditional single-layer insulating thin films. FIGS. 4A-B show an insulating thin film 100 with a two-layer structure manufactured by a co-extrusion process of the present application, for overcoming the deficiencies of single-layer insulating thin films manufactured by traditional structures and processes. FIG. 4A shows the molten state of the insulating material of the upper and lower layers before being co-extruded (i.e., before entering a die). As shown in FIG. 4A, the molten insulating materials of the upper and lower layers contain bubbles 401.1 and/or foreign matters 402. As shown in FIG. 4B, after the insulating thin film is formed by the co-extrusion process, the bubbles 401.1 and/or foreign matters 402 in the upper layer of the insulating thin film are pressed flat in the upper layer, i.e., do not extend into the lower layer. Therefore, as long as there are no bubbles and/or foreign matters in positions in the lower layer corresponding to the bubbles 401.1 and/or foreign matters 402, the insulating thin film 100 with a two-layer structure can meet the breakdown resistance index at the positions of the bubbles 401.1 and/or foreign matters 402; likewise, the bubbles 401.2 in the lower layer of the insulating thin film are pressed flat in the lower layer, i.e., do not extend into the upper layer; as long as there are no bubbles and/or foreign matters in positions in the upper layer corresponding to the bubbles 401.2, the insulating thin film 100 with a two-layer structure can meet the breakdown resistance index at the positions of the bubbles 401.2. That is to say, in the insulating thin film 100 with a two-layer structure formed by the co-extrusion process, even if the upper and lower layers both contain bubbles and/or foreign matters, as long as the bubbles and/or foreign matters in the upper and lower layers of the insulating thin film 100 with a two-layer structure do not overlap in position, the insulating thin film 100 can still meet the breakdown resistance index.

The applicant has found that according to the insulating thin film 100 with a two-layer structure provided by the present application, the probability of the bubbles and/or foreign matters in the upper thin film layer and the bubbles and/or foreign matters in the lower thin film layer overlapping in the thickness direction of the thin film is very low. Thus, the probability of bubbles and/or foreign matters penetrating the insulating thin film 100 in the thickness direction of the insulating thin film 100 is lower with respect to single-layer thin films. Therefore, compared with the traditional thin films with a single-layer structure, the probability of the insulating thin film 100 of the present application being broken down during use is reduced, so that the breakdown resistance index can be met. FIGS. 4C and 4D show an insulating thin film 200 with a three-layer structure manufactured by a co-extrusion process of the present application, for overcoming the deficiencies of single-layer insulating thin films manufactured by traditional structures and processes. FIG. 4C shows the molten state of the insulating material of the upper, middle and lower layers before being co-extruded (i.e., before entering a die). As shown in FIG. 4C, the molten-state insulating materials of the upper and middle layers contain bubbles and/or foreign matters.

FIG. 4D shows that after being extruded, bubbles 411.2 and/or foreign matters 412 in the molten insulating material of the middle layer are pressed flat in the middle layer, and regardless of the shapes and sizes of the bubbles 411.2 and the foreign matters 412, the bubbles 411.2 and/or foreign matters 412 in the middle layer do not extend into the upper and lower layers. Therefore, as long as there are no bubbles and/or foreign matters at the positions in the upper and lower layers corresponding to the bubbles 411.2 and/or foreign matters 412 in the middle layer, the insulating thin film 200 with a three-layer structure can meet the breakdown resistance index at the positions of the bubbles 411.2 and/or foreign matters 412. Likewise, the bubbles 411.1 in the molten insulating material of the upper layer are pressed flat in the upper layer, and regardless of the shapes and sizes of the bubbles 411.1, the bubbles 411.1 in the upper layer do not extend into the middle and lower layers. Therefore, as long as there are no bubbles and/or foreign matters in positions in the middle and lower layers corresponding to the bubbles 411.1 in the upper layer, the insulating thin film 200 with a three-layer structure can meet the breakdown resistance index at the positions of the bubbles 411.1. That is to say, regardless of whether each of the three layers of molten-state insulating material contains bubbles and/or foreign matters, or one or two of the three layers of molten-state insulating material contains bubbles and/or foreign matters, after being extruded, the bubbles and/or foreign matters are pressed flat in the respective layers, i.e., the bubbles and/or foreign matters in each layer do not extend into the other layers; in addition, as long as there are no bubbles and/or foreign matters contained at positions in the other layers corresponding to the positions in any layer at which the bubbles and/or foreign matters are located, the insulating thin film 200 with a three-layer structure can meet the breakdown resistance index at the positions of the bubbles and/or foreign matters. Furthermore, even if the positions of the bubbles and/or foreign matters in two of the layers overlap, as long as there are no bubbles and/or foreign matters at the corresponding position in the other layer, the insulating thin film 200 with a three-layer structure can still meet the breakdown resistance index at the position.

The applicant has found that according to the insulating thin film 200 with a three-layer structure provided by the present application, the probability of the bubbles and/or foreign matters in the upper thin film layer, the middle thin film layer and the lower thin film layer all overlapping in the thickness direction of the thin film is very low. Thus, the probability of bubbles and/or foreign matters penetrating the insulating thin film 200 in the thickness direction of the insulating thin film 200 is lower with respect to single-layer thin films. Therefore, compared with the traditional thin films with a single-layer structure, the probability of the insulating thin film 200 of the present application being broken down during use is reduced, so that the breakdown resistance index can be met.

The applicant has summarized after a long-term observation that there may be bubbles and/or foreign matters generated in a thin film produced by an extrusion process, and the bubbles and/or foreign matters may be randomly distributed in the thin film. By using a thin film with a two or more-layer structure, on the one hand, the probability of bubbles and/or foreign matters penetrating the thin film at the same position in the thickness direction of the thin film is reduced; on the other hand, since the thickness of each of the layers in the thin film with a two or more-layer structure is smaller with respect to a thin film with a single-layer structure, each of the layers in the thin film undergoes a higher draw ratio with respect to a thin film with a single layer, in said co-extrusion process described hereinafter, facilitating the orientation distribution of bubbles and foreign matters; by the co-action of these two aspects, the breakdown resistance of the thin film can be improved. In addition, with the increase of the number of layers of the insulating thin film, the probability of bubbles and/or foreign matters penetrating the thin film at the same position in the thickness direction of the thin film further decreases, and the thickness of each layer further decreases with respect to a thin film with a single-layer structure, so the pull-up ratio undergone in the co-extrusion process further increases. Therefore, the larger the number of layers of the insulating thin film, the better the breakdown resistance of the thin film, and reference can be made to examples in the following table for details.

The following table shows breakdown voltage test results for insulating thin films with different numbers of layers. The insulating thin film test samples with different numbers of layers as used in the test are all made of a flame retardant PC using a co-extrusion method, and during co-extrusion, the total thicknesses of these insulating thin film test samples with different numbers of layers are drawn to 0.25 mm. The resulting breakdown voltage results for the insulating thin film test samples with different numbers of layers are as shown in the following table:

| | Single-layer | Two-layer | Three-layer |
|---|---|---|---|
| Breakdown voltage, KV | 7 | 11 | 14 |

Where the total thickness of the insulating thin film is constant, the larger the number of layers, the smaller the thickness of each thin film, and an excessively small thin film thickness will increase the difficulty and cost of the process; in the present application, the number of layers of the insulating thin film is preferably 2-5 layers.

Figure 5:
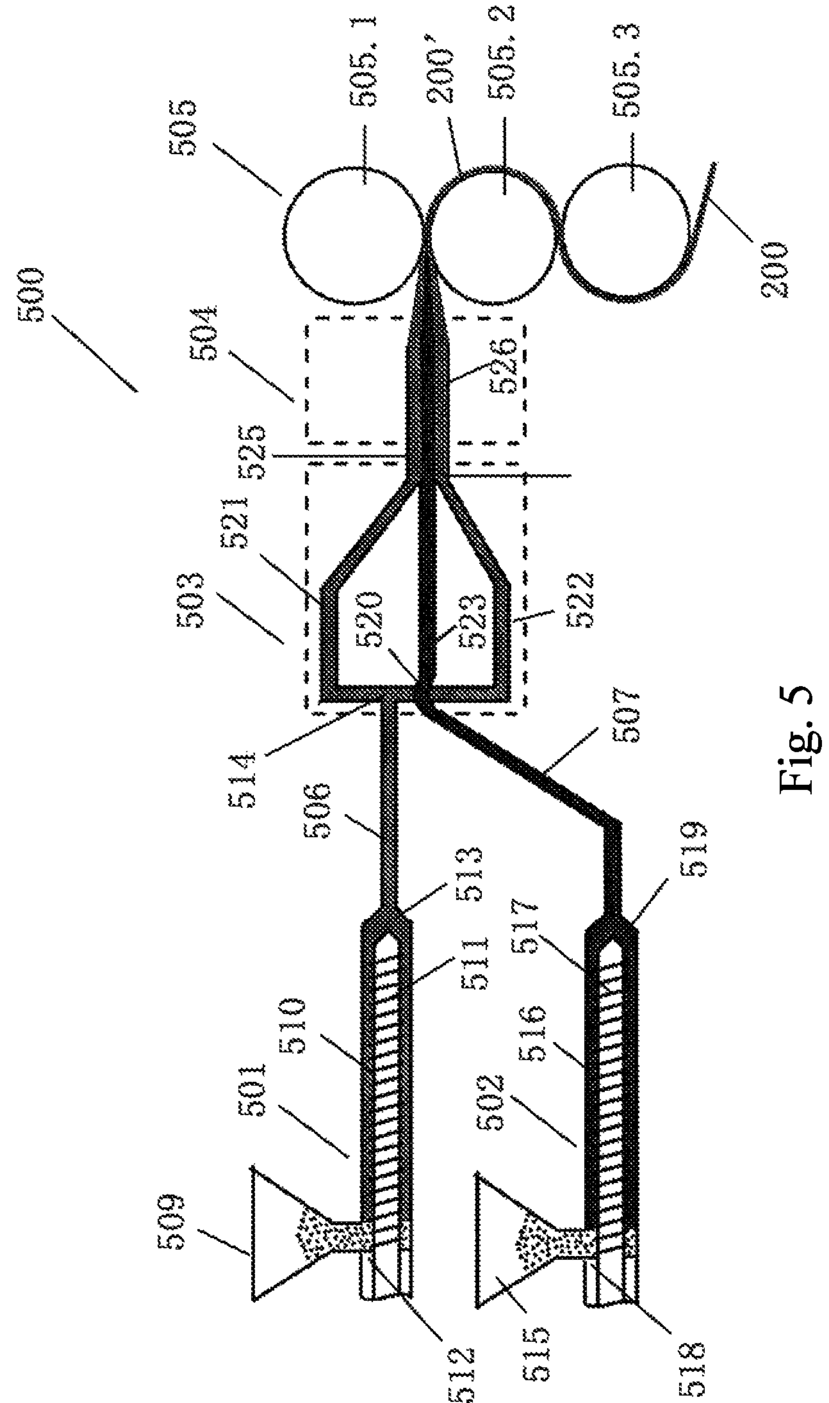
FIG. 5 shows a schematic view of a co-extrusion process for producing an insulating thin film with a three-layer structure according to the present application.

FIG. 5 schematically shows a co-extrusion line 500 for the procedure of a co-extrusion process for producing an insulating thin film 200 with a three-layer structure according to one embodiment of the present application. As shown in FIG. 5, the co-extrusion line 500 comprises a first extruder 501 and a second extruder 502. The first extruder 501 comprises a hopper 509 and a cavity 510. The hopper 509 is used for containing an insulating material. In the cavity 510, a drive screw 511 is provided. An outlet of the hopper 509 is in communication with a front end inlet 512 of the cavity 510, a rear end outlet 513 of the cavity 510 is in communication with an inlet of a pipe 506, and an outlet of the pipe 506 is in communication with a first inlet 514 of a dispenser 503. The second extruder 502 comprises a hopper 515 and a cavity 516. The hopper 515 is used for containing an insulating material. In the cavity 516, a drive screw 517 is provided. An outlet of the hopper 515 is in communication with a front end inlet 518 of the cavity 516, a rear end outlet 519 of the cavity 516 is in communication with an inlet of a pipe 507, and an outlet of the pipe 507 is in communication with a second inlet 520 of the dispenser 503.

The first inlet 514 of the dispenser 503 is in communication with an inlet of a first branch pipe 521 and an inlet of a second branch pipe 522 of the dispenser, and a second inlet 520 of the dispenser 503 is in communication with an inlet of a third branch pipe 523 of the dispenser. As shown in FIG. 5, the third branch pipe 523 is located between the first branch pipe 521 and the second branch pipe 522. The outlet of the first branch pipe 521, the outlet of the second branch pipe 522, and the outlet of the third branch pipe 523 merge at an outlet 524 of the dispenser. The outlet 524 of the dispenser is in communication with the inlet of the pipe 525, and the outlet of the pipe 525 is in communication with an inlet of a die cavity 526 of a die 504. The die cavity 526 of the die 504 has an appropriate width and depth so that it is sufficient to accommodate the materials delivered from the pipes of the dispenser, and the die cavity 526 is flat so that the materials delivered from the conveyor pipes are die-pressed into a flat shape therein. The die-pressed material is conveyed from the outlet of the die cavity 526 to a forming roller apparatus 505. The forming roller apparatus 505 comprises a plurality of forming rollers placed close to each other. The material conveyed from the die cavity of the die to the forming roller apparatus is drawn, rolled and cooled between the plurality of forming rollers so that the material achieves a desired thickness and is formed into a sheet. FIG. 5 shows such three forming rollers 505.1, 505.2 and 505.3. In other embodiments, there may also be only two rollers or more than three forming rollers.

According to the co-extrusion line 500 shown in FIG. 5, the process of the production of the insulating thin film 200 of the present application is as follows:

In the production process, the cavities 510 and 516 of the first extruder 501 and the second extruder 502 are heated, and the drive screws 511 and 517 of the first extruder 501 and the second extruder 502 are rotated.

An insulating material is added to the hopper 509 of the first extruder 501. The insulating material may be a material capable of realizing an insulating function or insulating and flame retardant functions, for example, a thermoplastic resin comprising a flame retardant. The rotation of the drive screw 511 of the first extruder 501 pushes the insulating material in the hopper 509 into the cavity 510. Since the cavity 510 is heated, the insulating material enters the cavity 510 and melts due to frictional heat to form a molten-state insulating material. Due to the influence of a propulsive force generated by the rotation of the drive screw 511, the insulating material in the molten state is conveyed toward the rear end outlet 513 of the cavity 510. The propulsive force generated by the rotation of the drive screw 511 causes the insulating material in the molten state to flow out of the cavity 510 from the rear end outlet 513 of the cavity 510, and then enters the pipe 506 via the inlet of the pipe 506 in communication with the rear end outlet 513 of the cavity 510. The insulating material in the molten state flows out from the outlet of the pipe 506 and reaches the first inlet 514 of the dispenser 503. The insulating material in the molten state is divided into two branches at the first inlet 514 of the dispenser, wherein the first branch enters the first branch pipe 521 of the dispenser and becomes a first molten insulating material, and the second branch enters the second branch pipe 522 of the dispenser and becomes a second molten insulating material.

Similarly, an insulating material that is the same or substantially the same as or similar to the insulating material added to the first extruder 501 is added to the hopper 515 of the second extruder 502. The rotation of the drive screw 517 of the second extruder 502 pushes the insulating material in the hopper 515 into the cavity 516. Since the cavity 516 is heated, the insulating material enters the cavity 516 and melts due to frictional heat to form a molten-state insulating material. Due to the influence of a propulsive force generated by the rotation of the drive screw 517, the insulating material in the molten state is conveyed toward the rear end outlet 519 of the cavity 516. The propulsive force generated by the rotation of the drive screw 517 causes the insulating material in the molten state to flow out of the cavity 516 from the rear end outlet 519 of the cavity 516, and then enters the pipe 507 via the inlet of the pipe 507 in communication with the rear end outlet 519 of the cavity 516. The insulating material in the molten state flows out from the outlet of the pipe 507, reaches the second inlet 520 of the dispenser 503, and enters the third branch pipe 523 of the dispenser via the second inlet 520 to become a third molten insulating material. It should be noted that this operation of the second extruder for the insulating material is performed simultaneously with the operation of the first extruder for the insulating material as described above.

The first molten insulating material entering the first branch pipe 521 of the dispenser 503, the third molten insulating material entering the third branch pipe 523 of the dispenser 503, and the second molten insulating material entering the second branch pipe 522 of the dispenser merge at the outlet 524 of the dispenser and are so stacked together, and enter the die cavity 526 of the die 504 via the pipe 525 in communication with the outlet 521 of the dispenser to undergo die pressing within the die cavity 526 to form a flat melt. After die pressing in the die cavity 526, bubbles and/or foreign matters in the first, second and third molten insulating materials are pressed in the respective layers formed from the first, second and third molten insulating materials, without extending into other layers. The die-pressed flat melt is conveyed between the forming rollers 505.1 and 505.2 and subjected to drawing and pressing forces applied thereto by the forming rollers 505.1 and 505.2, thereby adjusting the thickness of the melt while facilitating the orientation distribution of the bubbles and foreign matters. In addition, it is cooled by the forming rollers 505.1 and 505.2 to form a sheet or film 200' having a predetermined thickness. The film 200' continues to be sent and further cooled or annealed between the forming rollers 505.2 and 505.3 to form an insulating thin film or thin sheet 200 according to one embodiment of the present application. According to needs, the die-pressed flat melt discharged from the die may be molded by only two forming rollers or more than forming rollers.

Figure 6:
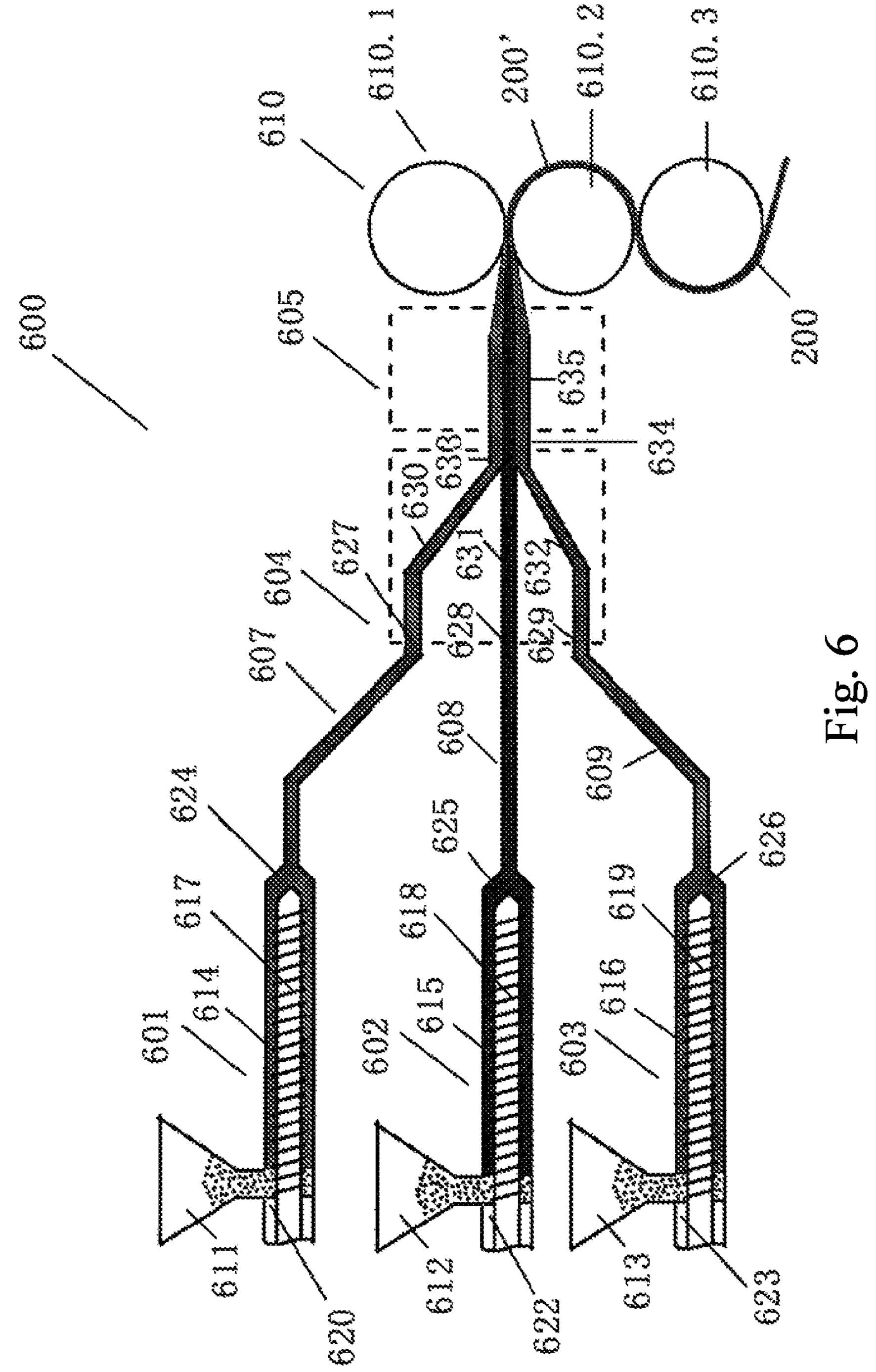
FIG. 6 shows a schematic view of another co-extrusion process for producing an insulating thin film with a three-layer structure according to the present application.

FIG. 6 shows a process line 600 for the procedure of another co-extrusion process for producing an insulating thin film 200 with a three-layer structure according to one embodiment of the present application. As shown in FIG. 6, the co-extrusion line 600 comprises a first extruder 601, a second extruder 602 and a third extruder 603. The first extruder 601, the second extruder 602 and the third extruder 603 respectively comprise a hopper 611, 612, 613, a cavity 614, 615, 616, and a drive screw 617, 618, and 619. The hoppers 611, 612 and 613 of the first, second and third extruders are used for containing insulating materials. An outlet of the hopper 611 of the first extruder 601 is in communication with a front end inlet 620 of the cavity 614, a rear end outlet 624 of the cavity 614 is in communication with an inlet of a pipe 607, and an outlet of the pipe 607 is in communication with a first inlet 627 of a dispenser 604. Similarly, an outlet of the hopper 612 of the second extruder 602 is in communication with a front end inlet 622 of the cavity 615, a rear end outlet 625 of the cavity 615 is in communication with an inlet of a pipe 608, and an outlet of the pipe 608 is in communication with a second inlet 628 of a dispenser 604. An outlet of the hopper 613 of the third extruder 603 is in communication with a front end inlet 623 of the cavity 616, a rear end outlet 626 of the cavity 616 is in communication with an inlet of a pipe 609, and an outlet of the pipe 609 is in communication with a third inlet 629 of the dispenser 604.

The first inlet 627 of the dispenser 604 is in communication with an inlet of a first branch pipe 630 of the dispenser, a second inlet 628 of the dispenser 604 is in communication with an inlet of a second branch pipe 631 of the dispenser, and a third inlet 629 of the dispenser 604 is in communication with an inlet of a third branch pipe 632 of the dispenser. As shown in FIG. 6, the second branch pipe 631 is located between the first branch pipe 630 and the third branch pipe 632. The outlet of the first branch pipe 630, the outlet of the second branch pipe 631, and the outlet of the third branch pipe 632 merge at an outlet 633 of the dispenser. The outlet 633 of the dispenser is in communication with the inlet of the pipe 634, and the outlet of the pipe 634 is in communication with an inlet of a die cavity 635 of a die 605. The die cavity 635 of the die 605 has an appropriate width and depth so that it is sufficient to accommodate the materials delivered from the pipes of the dispenser, and the die cavity 635 is flat so that the materials delivered from the conveyor pipes are die-pressed into a flat shape therein. The die-pressed material is conveyed from the outlet of the die cavity 635 to a forming roller apparatus 610. The forming roller apparatus 610 comprises a plurality of forming rollers placed close to each other. The material conveyed from the die cavity of the die to the forming roller apparatus is drawn, rolled and cooled between the plurality of forming rollers so that the material achieves a desired thickness and is formed into a thin film or sheet. FIG. 6 shows such three forming rollers 610.1, 610.2 and 610.3. In other embodiments, there may also be only two rollers or more than three forming rollers.

According to the co-extrusion line 600 shown in FIG. 6, the process of the production of the insulating thin film 200 of the present application is as follows:

In the production process, the cavities 614, 615 and 616 of the first extruder 601, the second extruder 602 and the third extruder 603 are heated, and the drive screws 617, 618 and 619 of the first extruder 601, the second extruder 602 and the third extruder 603 are rotated.

An insulating material is added to the hopper 611 of the first extruder 601. The insulating material may be a material capable of realizing an insulating function or insulating and flame retardant functions, for example, a thermoplastic resin comprising a flame retardant. The rotation of the drive screw 617 of the first extruder 601 pushes the insulating material in the hopper 611 into the cavity 614. Since the cavity 614 is heated, the insulating material enters the cavity 614 and melts due to frictional heat to form a molten-state insulating material. Due to the influence of a propulsive force generated by the rotation of the drive screw 617, the insulating material in the molten state is conveyed toward the rear end outlet 624 of the cavity 614. The propulsive force generated by the rotation of the drive screw 617 causes the insulating material in the molten state to flow out of the cavity 614 from the rear end outlet 624 of the cavity 614, and then enter the pipe 607 via the inlet of the pipe 607 in communication with the rear end outlet 624 of the cavity 614. The insulating material in the molten state flows out from the outlet of the pipe 607, reaches the first inlet 627 of the dispenser 604, and enters the first branch pipe 630 of the dispenser 604, and the insulating material that enters the first branch pipe 630 of the dispenser 604 is a first molten insulating material.

Likewise, an insulating material is added to the hopper 612 of the second extruder 602, and the insulating material is the same or substantially the same as or similar to the insulating material added to the first extruder 601. The insulating material is sent to the second branch pipe 631 of the dispenser 604 in the same manner as that for the insulating material in the hopper 611 of the first extruder 601 and becomes a second molten insulating material.

Likewise, an insulating material is added to the hopper 613 of the third extruder 603, and the insulating material is the same or substantially the same as or similar to the insulating material added to the first extruder 601 and the second extruder 602. The insulating material is sent to the third branch pipe 632 of the dispenser 604 in the same manner as that for the insulating material in the hopper 611 of the first extruder 601, and enters the third branch pipe 632 of the dispenser 604 to become a third molten insulating material.

It should be noted that the above operations of sending the insulating materials separately to the first branch pipe 630, the second branch pipe 631 and the third branch pipe 632 of the dispenser are performed simultaneously.

Similarly to the extrusion process in the process line as shown in FIG. 5, the first molten insulating material entering the first branch pipe 630 of the dispenser 604, the second molten insulating material entering the second branch pipe 631 of the dispenser 604 and the third molten insulating material entering the third branch pipe 632 of the dispenser merge at the outlet 633 of the dispenser and are so stacked together, and enter the die cavity 635 of the die 605 via the pipe 634 in communication with the outlet 633 of the dispenser to undergo die pressing within the die cavity 635 to form a flat melt. After die pressing in the die cavity 635, bubbles and/or foreign matters in the first, second and third molten insulating materials are pressed in the respective layers formed from the first, second and third molten insulating materials, without extending into other layers. The die-pressed flat melt is conveyed between the forming rollers 610.1 and 610.2 and subjected to drawing and pressing forces applied thereto by the forming rollers 610.1 and 610.2, thereby forming a sheet or film 200' having a predetermined thickness. During the drawing and pressing process, the thickness of the melt is adjusted while facilitating the orientation distribution of bubbles and foreign matters. The film 200' continues to be sent and further subjected to cooling or annealing between the forming rollers 610.2 and 610.3 to form an insulating thin film or thin sheet 200 according to one embodiment of the present application. According to needs, the die-pressed flat melt discharged from the die may be molded by only two forming rollers or more than three forming rollers.

Figure 7:
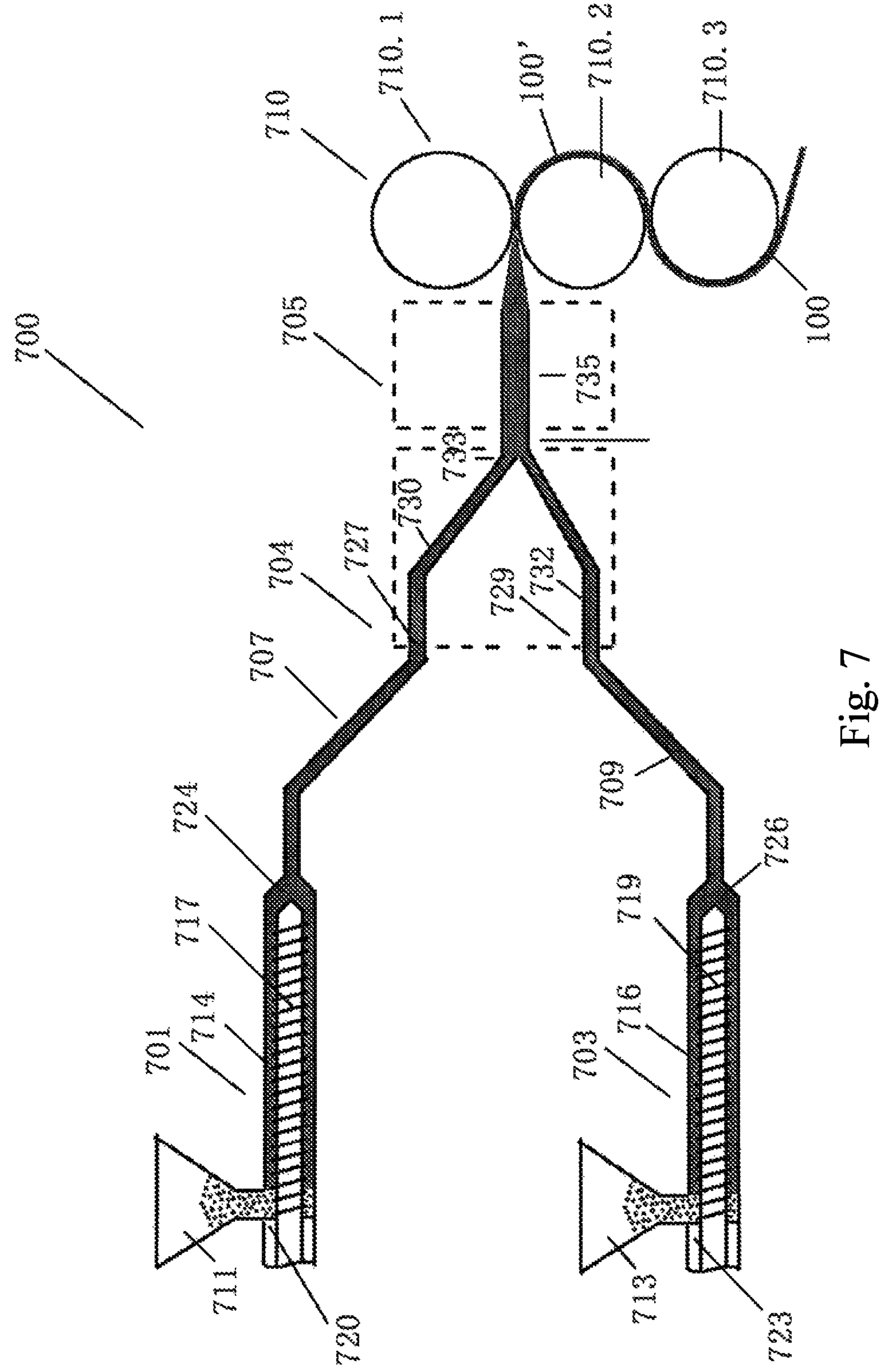
FIG. 7 shows a schematic view of a co-extrusion process for producing an insulating thin film with a two-layer structure according to the present application.

FIG. 7 shows a process line 700 for the procedure of a co-extrusion process for producing an insulating thin film 100 with a two-layer structure according to one embodiment of the present application. As shown in FIG. 7, the co-extrusion line 700 comprises a first extruder 701 and a second extruder 703. The first extruder 701 and the second extruder 703 respectively comprise a hopper 711, 713, a cavity 714, 716, and a drive screw 717, 719. The hoppers 711 and 713 of the first and second extruders are used for containing insulating materials. An outlet of the hopper 711 of the first extruder 701 is in communication with a front end inlet 720 of the cavity 714, a rear end outlet 724 of the cavity 714 is in communication with an inlet of a pipe 707, and an outlet of the pipe 707 is in communication with a first inlet 727 of a dispenser 704. Similarly, an outlet of the hopper 713 of the second extruder 703 is in communication with a front end inlet 723 of the cavity 716, a rear end outlet 726 of the cavity 716 is in communication with an inlet of a pipe 709, and an outlet of the pipe 709 is in communication with a second inlet 729 of the dispenser 704.

The first inlet 727 of the dispenser 704 is in communication with an inlet of a first branch pipe 730 of the dispenser, and a second inlet 729 of the dispenser 704 is in communication with an inlet of a second branch pipe 732 of the dispenser. The outlet of the first branch pipe 730 and the outlet of the second branch pipe 732 merge at an outlet 733 of the dispenser. The outlet 733 of the dispenser is in communication with the inlet of the pipe 734, and the outlet of the pipe 734 is in communication with an inlet of a die cavity 735 of a die 705. The die cavity 735 of the die 705 has an appropriate width and depth so that it is sufficient to accommodate the materials delivered from the pipes of the dispenser, and the die cavity 735 is flat so that the materials delivered from the conveyor pipes are die-pressed into a flat shape therein. The die-pressed material is conveyed from the outlet of the die cavity 735 to a forming roller apparatus 710. The forming roller apparatus 710 comprises a plurality of forming rollers placed close to each other. The material conveyed from the die cavity of the die to the forming roller apparatus is drawn, rolled and cooled between the plurality of forming rollers so that the material achieves a desired thickness and is formed into a sheet. FIG. 7 shows such three forming rollers 710.1, 710.2 and 710.3. In other embodiments, there may also be only two rollers or more than three forming rollers.

According to the co-extrusion line 700 shown in FIG. 7, the process of the production of the insulating thin film 100 of the present application is as follows:

In the production process, the cavities 714 and 716 of the first extruder 701 and the second extruder 703 are heated, and the drive screws 717 and 719 of the first extruder 701 and the second extruder 703 are rotated.

An insulating material is added to the hopper 711 of the first extruder 701. The insulating material may be a material capable of realizing an insulating function or insulating and flame retardant functions, for example, a thermoplastic resin comprising a flame retardant. The rotation of the drive screw 717 of the first extruder 701 pushes the insulating material in the hopper 711 into the cavity 714. Since the cavity 714 is heated, the insulating material enters the cavity 714 and melts into a molten state due to frictional heat. Due to the influence of a propulsive force generated by the rotation of the drive screw 717, the insulating material in the molten state is conveyed toward the rear end outlet 724 of the cavity 714. The propulsive force generated by the rotation of the drive screw 717 causes the insulating material in the molten state to flow out of the cavity 714 from the rear end outlet 724 of the cavity 714, and then enters the pipe 707 via the inlet of the pipe 707 in communication with the rear end outlet 724 of the cavity 714. The insulating material in the molten state flows out from the outlet of the pipe 707, reaches the first inlet 727 of the dispenser 704, and enters the first branch pipe 730 of the dispenser 704. The insulating material entering the first branch pipe 730 of the dispenser 704 is a first molten insulating material.

Likewise, an insulating material is added to the hopper 713 of the second extruder 703. The insulating material is the same or substantially the same as or similar to the insulating material added to the first extruder 701. The insulating material is sent to the second branch pipe 732 of the dispenser 704 in the same manner as that for the insulating material in the hopper 711 of the first extruder 701. The insulating material entering the second branch pipe 732 of the dispenser 704 is a second molten insulating material.

It should be noted that the above operations of sending the insulating materials separately to the first branch pipe 730 and the second branch pipe 732 of the dispenser are performed simultaneously.

Similarly to the extrusion process in the process line as shown in FIG. 6, the first molten insulating material entering the first branch pipe 730 of the dispenser 704 and the second molten insulating material entering the second branch pipe 732 of the dispenser 704 merge at the outlet 733 of the dispenser and are so stacked together, and enter the die cavity 735 of the die 705 via the pipe 734 in communication with the outlet 733 of the dispenser to undergo die pressing within the die cavity 735 to form a flat melt. After die pressing in the die cavity 735, bubbles and/or foreign matters in the first and second molten insulating materials are pressed in the respective layers formed from the first and second molten insulating materials, without extending into the other layer. The die-pressed flat melt is conveyed between the forming rollers 710.1 and 710.2 and subjected to drawing and pressing forces applied thereto by the forming rollers 710.1 and 710.2, thereby forming a sheet or film 100' having a predetermined thickness. During the drawing and pressing process, the thickness of the melt is adjusted while facilitating the orientation and distribution of bubbles and foreign matters. The film 100' continues to be sent and further subjected to cooling or annealing between the forming rollers 710.2 and 710.3 to form an insulating thin film or thin sheet 100 with a two-layer structure according to one embodiment of the present application. According to needs, the die-pressed flat melt discharged from the die may be molded by only two forming rollers or more than forming rollers.

Figure 8:
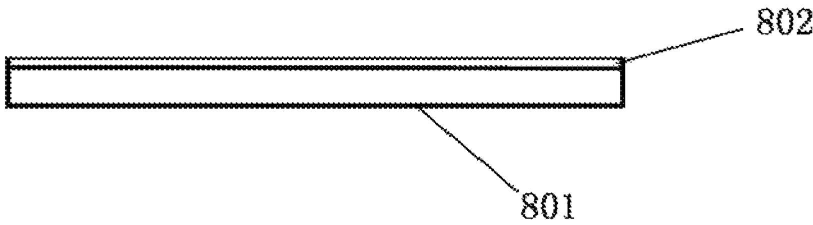
FIG. 8 is a schematic view of the insulating thin film of the present application applied to the surface of a printed circuit board (PCB board).

FIG. 8 is an application example of the present application, wherein an insulating thin film 802 of the present application, which may be the insulating thin film 100 with a two-layer structure or the insulating thin film 200 with a three-layer structure, or may also be an insulating thin film with a three or more-layer structure in this application, is attached to the surface of a PCB element 801, for insulating the surface of the PCB element.

It should be understood that for each numerical range given in this description, any numerical value within the numerical range may be selected.

In general, the structures of electronic products are designed to be compact and aesthetic, and electronic elements and parts on the motherboards thereof are distributed at high densities, and are often protected for insulation using insulating thin films. In terms of thin films, the whole thin films are uniform and stable, but it is also impossible to avoid some specific articles with defects, such as bubbles and carbides, affecting the insulating effect, and flame retardant products are particularly prone to appear. Once the insulating thin film is broken down by voltage due to defects at some specific positions, the electronic elements and parts may not work properly, thereby affecting the service of the entire electronic product. Therefore, an insulating sheet acts as a functional component, and the uniformity thereof has a non-negligible impact on the operation of a product, so it is especially necessary to eliminate potential risks.

It is recognized in the present application that for the materials of traditional single-layer insulating thin films used for insulation or insulation and flame retarding, there are many ingredient combinations, and the ingredient combinations thereof may be different or vary for different types of single-layer insulating thin films; although such traditional structures can also meet the requirements for the insulation of electronic devices, electronic components, electronic elements, or electronic elements in electronic devices and electronic components, such traditional structures have two potential deficiencies due to the influence of foreign matters (e.g., dust particles) and/or bubbles: (1) the voltage breakdown withstanding performance across the entire single-layer insulating thin film may be uneven. During use, some parts are easily broken down due to the influence of foreign matters (such as dust particles) and/or bubbles in a specified service environment, this deficiency of potential breakdown being difficult to predict in advance; and (2) by product testing, it is found that in the production process, due to the influence of dust particles and bubbles, the pass rate is reduced. It is recognized in the present application that by changing the structure of a traditional single-layer insulating thin film having a plurality of components into two layers or three or more layers, the two deficiencies of the structure of the traditional single-layer insulating thin film are overcome without changing the structural material of the single-layer insulating thin film.

Although this description shows, describes and indicates novel features of the present application that are applicable to the preferred embodiments of the present application, it should be understood that a person skilled in the art would be able to omit, replace and change the apparatuses and the operations thereof and the details thereof without departing from the spirit of the present application. For example, it is in particular pointed out that combinations of elements and/or method steps which perform substantially the same function in substantially the same manner to achieve the same results are within the scope of the present application. In addition, it should be appreciated that the forms disclosed in the present application or the structures and/or components and/or method steps as illustrated and/or described in the embodiments may be combined as design options into other forms or embodiments. Therefore, the scope of protection of the present application is merely limited to the scope of the appended claims.

What is claimed is:

1. A two-layer insulating film for insulating an electronic device, an electronic component, or an electronic element in an electronic device or an electronic component, wherein the two-layer insulating film comprises:

an upper film layer in contact with a lower film layer, wherein the upper film layer and said lower film layer each comprise a thermoplastic resin, wherein said upper film layer and said lower film layer are formed from the same insulating material or similar insulating materials, and a mass of flame retardant in each of said upper film layer and said lower film layer is between 5%-50% of the mass of that layer, the mass of thermoplastic resin in each of said upper film and said lower film layers is between 50%-95% of the mass of that layer, and the portion of thermoplastic resin in the upper film layer is the same or similar as the portion of thermoplastic resin in the lower film layer; and said two-layer insulating film is integrally formed by subjecting said upper film layer and said lower film layer to a co-extrusion process.

2. The insulating film as claimed in claim 1, wherein the thermoplastic resin comprises PP, PC or PET, and the total thickness of said thin film is 0.05-0.25 mm.

3. The insulating film as claimed in claim 1, wherein the insulating material for manufacturing said upper film layer comprises PP and a flame retardant; and the insulating material for manufacturing said lower film layer comprises PP and a flame retardant.

4. The insulating film as claimed in claim 1, wherein the insulating material for manufacturing said upper film layer comprises PC and a flame retardant; the the insulating material for manufacturing said lower film layer comprises PC and a flame retardant.

5. The insulating film as claimed in claim 1, wherein the insulating material for manufacturing said upper film layer comprises PET and a flame retardant; and the insulating material for manufacturing said lower film layer comprises PET and a flame retardant.

6. The insulating film as claimed in claim 1, wherein:

the upper film layer and the lower film layer have defects; and the defects in the upper film layer do not overlap with the defects in the lower film layer.

7. The insulating film as claimed in claim 6, wherein the defects include at least one bubble, foreign matter, or a combination thereof.

8. An insulating film for insulating an electronic device, an electronic component, or an electronic element in an electronic device or an electronic component, wherein the insulating film comprises:

an upper film layer, a middle film layer and a lower film layer, wherein the upper film layer, the middle film layer, and the lower film layer each comprises a thermoplastic resin, wherein the upper film layer, said middle film layer and said lower film layer are formed from the same insulating material or similar insulating materials, and a mass of flame retardant in each of said upper film layer, said middle film layer, and said lower film layer is between 5%-50% of the mass of that layer, wherein the mass of thermoplastic resin in each of said upper film layer, said middle film layer, and said lower film layer is between 50%-95% of the mass of that layer; and the upper film layer, the middle film layer, and the lower film layer have a same or similar portions of thermoplastic resin; and the insulating film is integrally formed by subjecting said upper film layer, said middle film layer and said lower film layer to a co-extrusion process.

9. The insulating film as claimed in claim 8, wherein the thermoplastic resin comprises PP, PC or PET, and the total thickness of said film is 0.05-0.25 mm.

10. The insulating film as claimed in claim 8, wherein the upper film layer, the middle film layer, and the lower film layer each comprises a halogen-free flame retardant.

11. The insulating film as claimed in claim 8, wherein:

the upper film layer, the middle film layer, and the lower film layer have defects; and the defects in the upper film layer do not overlap with the defects in the middle film layer, and the defects in the lower film layer do not overlap with the defects in the middle film layer.

12. The insulating film as claimed in claim 11, wherein the defects include at least one bubble, foreign matter, or a combination thereof.

* * * * *